METHOD FOR FABRICATING PRINTED CIRCUIT COMPONENTS

Filed Feb. 28, 1962

INVENTORS: H. N. KELLER
D. A. McLEAN
B. H. VROMEN
BY Edward M. Fink
ATTORNEY 3,294,653
Patented Dec. 27, 1966

3,294,653

METHOD FOR FABRICATING PRINTED CIRCUIT COMPONENTS

Harry N. Keller, Mountain Lakes, David A. McLean, Chatham, and Benjamin H. Vromen, Plainfield, N.J., assignors to Bell Telephone Laboratories, Incorporated, New York, N.Y., a corporation of New York Filed Feb. 28, 1962, Ser. No. 176,298
6 Claims. (Cl. 204—15)

This invention relates to a method for the selective anodization of patterns of refractory film-forming metals delineated by mechanical masking or photoengraving techniques on suitable substrates. The resultant assemblies are particularly well suited for use in the fabrication of printed circuit components such as resistors, capacitors and interconnections.

Embodiments of the present invention are directed to both the formation of thin film patterns and the removal of undesired metal, and to the selective anodization of previously formed thin film patterns. The discussion contained herein is written largely in terms of the former which is to be considered the preferred embodiment.

There are several applications in the field of industry which require the production of metallic designs or patterns on various substrates. Thus, for example, in the fabrication of semiconductive devices, it is often necessary to produce metallic electrode patterns on the surfaces thereof. Another instance requires the use of metallic designs or patterns for the fabrication of printed circuit capacitors in accordance with the method described in United States Patent 2,993,266, granted July 25, 1961, to R. W. Berry.

The simplest methods of producing metallic patterns or configurations upon substrate materials involve the use of a mask in conjunction with vacuum evaporation or sputtering techniques as described by L. Holland in "Vacuum Deposition of Thin Films," J. Wiley & Sons, 1956. Although such methods are widely used, certain disadvantages are inherent when the metallic patterns to be produced are extremely minute in size or intricate in detail. In such cases, the masks, which are fabricated with openings corresponding to the configuration of the desired metal, tend to be fragile and difficult to handle. For these reasons, photoengraving techniques are generally preferred for the production of intricate or highly detailed metallic patterns on a substrate.

Exemplary of the use of photoengraving to produce fine detail patterns is the production of artistic creations or printed matter on copper or zinc plates for printing or engraving purposes.

The conventional photoengraving process consists of the steps of coating the metal to be engraved with a light sensitive photo-resist, exposing certain portions of the resist to light, developing the resist so that those portions upon which the "light" impinged are stabilized, dissolving the unexposed resist, and contacting with a selective etchant which attacks and erodes the exposed metal and leaves the resist pattern and underlying metal untouched. The result of such processing is the production of a pattern in the metal surface which corresponds with the pattern of light employed in exposing the resist.

Conventional photo-resists, such as those produced by the Eastman Kodak Company (see, for example, United States Patents 2,670,285, 2,670,286, 2,670,287) have been developed for use with metals, such as copper, zinc and aluminum, which are attacked by mild reagents such as ferric chloride, acetic acid and dilute mineral acids. However, such resists, which are basically hydrocarbons, are readily attacked by strong etchants such as hydrofluoric acid and concentrated nitric, hydrochloric and sulfuric acids. Accordingly, photoengraving techniques employing conventional photo-resist materials have been applied with difficulty to relatively inert metals which are eroded only by strong etchants of the type listed above. Thus, although tantalum is a film-forming metal which is advantageously employed in the fabrication of printed circuit capacitors of the type described in the above-mentioned patent of R. W. Berry, it cannot easily be shaped by conventional photoengraving techniques since it is unaffected by mild etchants. On the contrary, such a procedure requires that the photo-resist be given a carefully controlled stabilizing treatment. In accordance with the present invention printed circuit components are prepared by depositing a layer of a refractory film-forming metal on a substrate by condensation techniques. Next, the region to be anodized is delineated by depositing a layer of aluminum upon the film-forming metal by photoengraving or mechanical masking techniques. Following, the entire assembly is anodized and the anodized layer of aluminum removed, either alone or together with that portion of the film-forming metal lying thereunder.

In the preferred embodiment of the present invention intricate designs and patterns of metals, which are not readily attacked by the mild etchants commonly used in conjunction with conventional photoengraving techniques, are produced with a high degree of precision and detail without the attendant difficulties described above.

More specifically, this embodiment of the present invention involves successively depositing a refractory film-forming metal and a layer of aluminum on a substrate by condensation techniques. Next, the aluminum layer is photoengraved so as to remove the aluminum from those portions of the film-forming metal which will ultimately be covered with the desired pattern or configuration.

The next step in the process comprises anodizing the remaining aluminum and exposed refractory film-forming metal, thereby forming a pattern of anodized refractory film-forming metal contrasting with non-anodized film-forming metal overlaid by anodized aluminum. The final step consists of treating the assembly with a conventional etchant for the inert metals, so utilizing the anodic layer of the refractory film-forming metal as a resist and removing the anodized aluminum and underlying layer of film-forming metal. In this process, the anodic oxide on the refractory metal operates as the ultimate resist.

Other advantages and various features of the invention will become apparent by reference to the following description taken in conjunction with the accompanying drawing forming a part thereof and from the appended claims wherein:

The inventive technique disclosed herein may, in its simplest form, be effectively employed as a method for selectively anodizing a preformed pattern of a refractory film-forming metal, such pattern having been produced in accordance with any of the well known prior art techniques, such as, mechanical masking or photoengraving.

Ofttimes it is desired to fabricate a printed circuit including resistors, capacitors, and interconnections and it becomes necessary to mask those areas of the pattern which need not be anodized.

To this end, an aluminum film may be evaporated by sputtering or condensation upon such representative circuit in those areas not desired to be anodized. Next, the exposed refractory film-forming metal, for example tantalum, and the aluminum film are anodized, for example, with a boric acid-sodium borate solution at voltages ranging up to about 50 volts direct-current. Following the anodization, the resultant aluminum oxide and remaining aluminum are dissolved with a solution of dilute hydrochloric acid or sodium hydroxide, thereby leaving the desired anodized tantalum pattern.

However, the present invention has its most important application in the fabrication of patterns of those materials which are not easily amenable to photoengraving by virtue of their insolubility in the mild type of etchant commonly used in conventional photoengraving techniques, and which form anodic films highly resistant to even strong acids. The aforementioned insoluble materials include such essentially inert metals as tantalum, niobium, titanium, tungsten and zirconium. It is these materials which are conventionally considered refractory and the terminology employed herein is consistent therewith.

Figure 1:
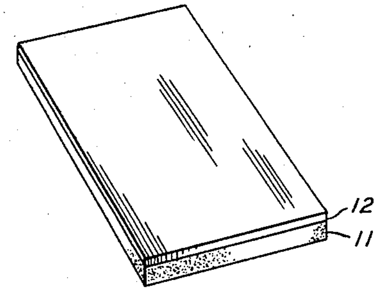
FIG. 1 is a perspective view of a ceramic block upon which a thin metallic layer of a film-forming metal has been deposited.

With reference now more particularly to the drawing, FIG. 1 shows a block 11 upon which a metallic pattern is to be produced in accordance with the present invention. The first step in the inventive technique comprises cleaning block 11 by conventional cleansing techniques, as for example, boiling in xylene, acetone and water. Following the cleaning procedure, a thin layer 12 of a film-forming metal, such as tantalum, is deposited upon block 11 by cathodic sputtering or vacuum evaporation techniques by conventional methods described by L. Holland, as noted above.

In general, the thickness of layer 12 is not critical and should be of sufficient magnitude to uniformly cover the surface of the substrate. For the purposes discussed herein such layers are preferably within the range of 300 to 5000 Angstroms. However, it will be appreciated by those skilled in the art that such limits are not absolute and variations may be made within the scope of the invention.

Figure 2:
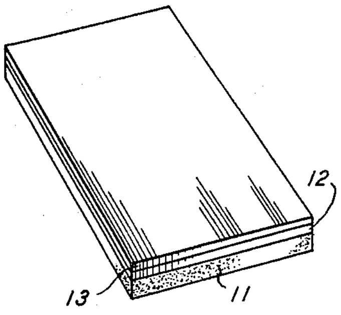
FIG. 2 is a perspective view of the ceramic block of FIG. 1 with a layer of aluminum deposited upon the film-forming metal.

The next step in the inventive process, depicted in FIG. 2, comprises depositing a layer 13 of aluminum upon and coextensive with layer 12 by cathodic sputtering or vacuum evaporation techniques. The thickness of layer 13 is preferably within the range of 1000 to 2500 Angstroms. Once again, it will be appreciated that the limits expressed are not absolute and variations may be made within the scope of the invention.

Next, following the deposition of aluminum layer 13, a pattern is photoengraved (in layer 13) so as to completely remove certain portions thereof. Any one of the well-known conventional photoengraving procedures may be used to effect this result. (See, "The Ferric Chloride Etching of Copper Photoengraving," Schoffert, Winkler, Vasler and Deubner (1949), published by Photo-Engravers Research, Inc., Columbus, Ohio; and "Photoengraving," Groesbeck, Doubleday Page and Company (1924).)

Figure 3:
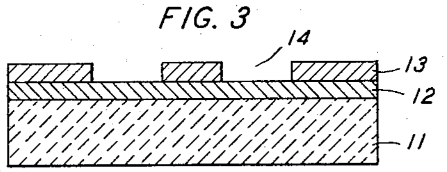
FIG. 3 is a cross-sectional view of the body of FIG. 2 after it has been photoengrazed.

FIG. 3 is a cross-sectional view of block 11 showing the pattern resulting from the removal of portions of layer 13. Numeral 14 designates the area from which aluminum is removed.

Figure 4:
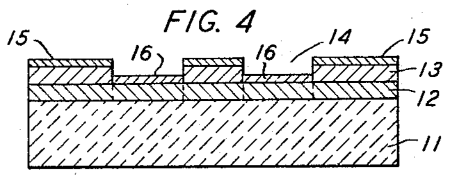
FIG. 4 is a cross-sectional view of the body of FIG. 3 after it has been anodized.

Following the photoengraving step, block 11, having portions of tantalum layer 12 exposed and the remaining portions of layer 13, is anodized by means of conventional techniques, as for example, with a boric acid-sodium borate solution, at voltages up to approximately 50 volts direct-current. The anodized assembly is shown in FIG. 4 having a layer 15 of anodized aluminum and a layer 16 of anodized tantalum.

The final step of the present process consists of removing anodized aluminum layer 15 together with the underlying aluminum layer 13 and tantalum layer 12 utilizing tantalum pentoxide layer 16 as an etching resist. To this end, the aluminum layers may first be removed with a mild etchant such as dilute hydrochloric acid or sodium hydroxide and then the tantalum layer is removed with a conventionally used strong acid, such as hydrofluoric. However, for expediency a solution of hydrofluoric acid or hydrofluoric and nitric acids may be used to effect removal of all three layers.

From the foregoing description, it is apparent that the ultimate pattern of metal desired is related to the configuration obtained by the photoengraving step in that the pattern obtained is a positive of the original photographic film or plate used. It is for this reason that patterns produced in accordance with the present invention are possessed of the same degree of detail and precision as that obtainable by photoengraving processes in general.

Figure 5:
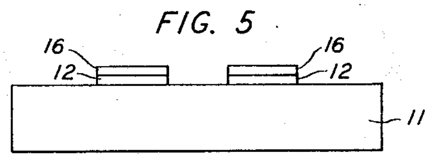
FIG. 5 is a cross-sectional view of the body of FIG. 4 after the anodized aluminum has been dissolved and the body etched in acid, thereby resulting in the desired pattern.

This completes formation of the pattern shown in FIG. 5, and the various geometric details which have been produced are suitable for resistors and interconnections. Furthermore, when desired the assembly may be processed further to produce other components, for example, capacitors.

For clarity of exposition of the design the pattern shown in FIG. 5 has been greatly simplified. It is to be appreciated that there is virtually no limit on the intricacy or detail of design which may be produced. Thus, a printed circuit resistor which may contain as many as twenty or thirty parallel segments joined to each other, the segments and spaces therebetween being of the order of one to two mils in width, may be produced in accordance with the general procedure outlined above.

Figure 6:
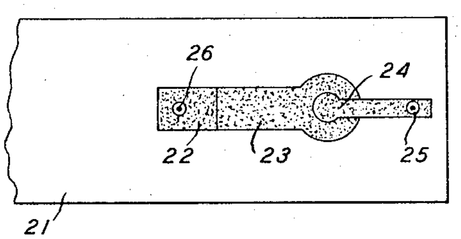
FIG. 6 is a plan view of a capacitor fabricated in accordance with the present invention.

FIG. 6 is a plan view of a capacitor produced in accordance with the present invention. Upon substrate 21 there is deposited a layer of tantalum 22 and anodically formed oxide dielectric layer 23 in accordance with the procedure outlined above. Upon layer 23 there is deposited an electrically conductive metal 24 as a counter-electrode. This metal may suitably be gold. The final step in the fabrication of the capacitors comprises making electrical connections to the tantalum electrode 22 and gold electrode 24 at points 25 and 26, respectively. This procedure is described in detail in the patent of R. W. Berry alluded to above.

In general, the substrate material is chosen in accordance with the end use of the metal pattern. Thus, for example, in the fabrication of printed circuit components it is recognized that the substrate may be composed of a material which is electrically nonconductive. Ceramic, glass and, in general, heat resistant materials are preferred for this purpose, particularly in view of the fact that deposition of metallic layers by sputtering or vacuum evaporation tends to increase the temperature of the substrate upon which the layer is being deposited.

Described in detail below are two examples of the present invention. The examples are intended merely as illustrative of the present invention and it is to be appreciated that the processes described may be varied by one skilled in the art without departing from the spirit and scope of the present invention.

*Example I*

This example describes the selective anodization of a representative tantalum circuit by means of the aluminum resist technique described herein.

A tantalum circuit consisting of a resistor, a capacitor and interconnections, obtained by conventional photoresist-etching techniques was employed. Employing a mechanical mask to protect those areas of the tantalum which it was desired not to anodize, a layer of aluminum 4500 A. thick was deposited by conventional evaporation techniques in which a two inch wire of 50 mil aluminum was evaporated. Next, the mask is removed and the entire assembly anodized in a 0.01 percent by weight citric acid solution at voltages ranging up to 150 volts. Finally, the anodized aluminum layer was removed by dissolution in dilute aqueous sodium hydroxide, so leaving a circuit pattern of partially anodized elements.

*Example II*

A pattern of metal suitable for use as a printed circuit resistor was deposited in the desired configuration in the following manner:

A soft glass slide, approximately 1½ inches in width and 3 inches in length was cleaned by boiling in xylene, acetone and water. A layer of tantalum 4500 A. thick was then deposited by conventional sputtering techniques and the assembly cleaned by boiling as described above.

The tantalum surface was then coated with a 2500 A. thick layer of aluminum by conventional evaporation techniques in which a two inch wire of 50 mil aluminum was evaporated.

Next, the aluminum surface was coated with a layer of Kodak Metal Etch Resist. After prebaking at 100° C., the photo-resist surface was exposed to a pattern of light through a photographic positive of a resistor pattern in a manner such that the entire slide was exposed except for the resistor lines themselves. The exposed layer was then treated in accordance with conventional photoengraving techniques and etched in a solution of four percent sodium hydroxide, thereby leaving a negative resistor pattern on the slide.

Following the photoengraving step, the slide was anodized in a solution of 12 grams of boric acid and 2 grams of sodium tetraborate in 400 ml. of water maintained at temperatures within the range of 80 to 90° C. at voltages ranging up to 35 volts to produce a layer of tantalum oxide about 650 A. thick.

Finally, the slide was etched with an aqueous solution of nitric and hydrofluoric acids, thereby removing the anodized aluminum and the underlying layers of aluminum and tantalum and leaving a well-defined resistor pattern of anodized tantalum.

While the invention has been described in detail in the foregoing description and the drawing similarly illustrates the same, the aforesaid is by way of illustration only and is not restrictive in character. The several modifications which will readily suggest themselves to persons skilled in the art are all considered within the broad scope of the invention, reference being had to the appended claims.

What is claimed is:

1. A method for the fabrication of a printed circuit component which comprises the steps of successively depositing a layer of a refractory film-forming metal selected from the group consisting of tantalum, niobium, titanium, tungsten and zirconium on a substrate, covering a portion of said layer with an aluminum pattern, anodizing the resultant assembly and removing the anodized aluminum and the aluminum contained thereunder, and removing the refractory film-forming metal lying under the said aluminum.

2. A method in accordance with the procedure of claim 1 wherein said refractory film-forming metal is tantalum.

3. A method in accordance with the procedure of claim 1 wherein said pattern of aluminum has a thickness within the range of 2000–2500 Angstroms.

4. A method in accordance with the procedure of claim 1 wherein said refractory film-forming metal lying under the said aluminum is removed with an etchant comprising an aqueous solution of hydrofluoric and nitric acids.

5. A method for the fabrication of a printed circuit resistor in accordance with the procedure of claim 1.

6. A method for the fabrication of an electrolytic capacitor in accordance with the procedure of claim 1 wherein a counter-electrode is deposited upon the remaining refractory film-forming metal.

References Cited by the Examiner

UNITED STATES PATENTS

| | | | |
|---|---|---|---|
| 2,706,697 | 4/1955 | Eisler | 204—143 |
| 2,930,741 | 3/1960 | Burger et al. | 204—33 |
| 2,993,266 | 7/1961 | Berry | 29—25.42 |
| 3,035,990 | 5/1962 | Davis et al. | 204—33 |
| 3,079,536 | 2/1963 | McLean | 204—42 |
| 3,099,610 | 7/1963 | Cybriwsky et al. | 204—33 |

OTHER REFERENCES

Handbook of Chemistry and Physics, Hodgman, Chemical Rubber Publishing Co., 1943, 26th Edition, pp. 466–7.

EARL M. BERGERT, *Primary Examiner.*

HAROLD ANSHER, ALEXANDER WYMAN, J. STEINBERG, *Examiners.*